United States Patent [19]

Ouyang

[11] 4,131,907
[45] Dec. 26, 1978

[54] SHORT-CHANNEL V-GROOVE COMPLEMENTARY MOS DEVICE

[76] Inventor: Paul H. Ouyang, 936 Junesong Way, San Jose, Calif. 95133

[21] Appl. No.: 837,613

[22] Filed: Sep. 28, 1977

[51] Int. Cl.² .............................................. H01L 27/02
[52] U.S. Cl. ........................................ 357/42; 357/22; 357/23; 357/55
[58] Field of Search .................... 357/22, 23, 55, 42

[56] References Cited
U.S. PATENT DOCUMENTS 3,975,752   8/1976   Nicolay ................................. 357/55

OTHER PUBLICATIONS

Electronics – Jan. 6, 1977 – p. 72.

Primary Examiner—Edward J. Wojciechowicz

[57] ABSTRACT

An improved short-channel complementary MOS transistor structure is provided. The problems of low punch-through voltage breakdown, and "short-channel effects" are particularly addressed and solved. Accurate and precise field protection of all area surrounding the channel, source and drain regions of both the p-channel MOS transistor device and the n-channel transistor device is simply and effectively accomplished. The threshold voltage of the n-channel MOS transistor device is precisely controlled by a boron implantation.

The method of manufacturing such device is disclosed.

11 Claims, 10 Drawing Figures

SHORT-CHANNEL V-GROOVE COMPLEMENTARY MOS DEVICE

BACKGROUND OF THE INVENTION

1. Field of the Invention

The invention relates to the field of high speed short-channel complementary MOS (CMOS) transistor structures and process of fabricating such CMOS transistor structures.

2. Description of the Prior Art

Complementary metal-oxide-semiconductor (CMOS) transistors are well-known in the art, and are often used in applications where low power consumption and high noise immunity are required. However, the channel lengths of either p-channel MOS transistors or n-channel MOS transistors of prior art CMOS transistors are generally determined by the precision of photolithographic and etching techniques during diffusion steps, and are practically limited to about four or five microns. Therefore, short-channel lengths of one micron are extremely difficult to obtained. Very high speed operations employing prior art CMOS integrated circuits have not been realized. In addition to the photolithographic limitation in achieving short-channel lengths, punch-through breakdown mechanism and short-channel effects in a short-channel device post severe problems in providing desired device characteristics.

SUMMARY AND OBJECTS OF THE INVENTION

The present invention obviates the foregoing disadvantages of the prior art by providing a self-alignment short-channel V-groove complementary MOS which has laterally disposed source and drain regions for both N-channel and P-channel MOS transistors.

According to the preferred embodiment of the present invention, there is provided a CMOS device comprising a lightly N-doped semiconductor substrate having a surface and a lightly P-doped tub therein; first and second P-type regions disposed between a first V-groove exposed by the opposite side surfaces of the first V-groove in the N-type semiconductor substrate; first and second N-type regions disposed between a second V-groove exposed by the opposite side surfaces of the second V-groove; a first P-type layer having a higher impurity doping concentration than the P-type tub terminating on all four sides of the second V-groove; $N^+$ and $P^+$ contacts regions to the substrate and the tub respectively; a channel stopper layer in the substrate and the tub respectively; a thin insulating layer over the first and second V-grooves; a relatively thick oxide layer of substantially uniform thickness covering the entire wafer, and appropriate conductor means.

It is therefore, an essential object of the present invention to provide an improved high speed complementary V-groove MOS for use in integrated circuits.

It is another object of the invention to provide an improved CMOS device in which the threshold voltage of the n-channel device can be directly controlled by ion implantation.

It is another object of the invention is provide an improved CMOS device in which punch-through breakdown voltage is high.

It is another object of the invention to provide an improved CMOS device in which the short-channel effects are significantly reduced.

It is another object of the invention to provide an improved CMOS device in which the channel region is precisely aligned to the source and drain regions.

DESCRIPTION OF THE PREFERRED EMBODIMENTS

Figure 1:
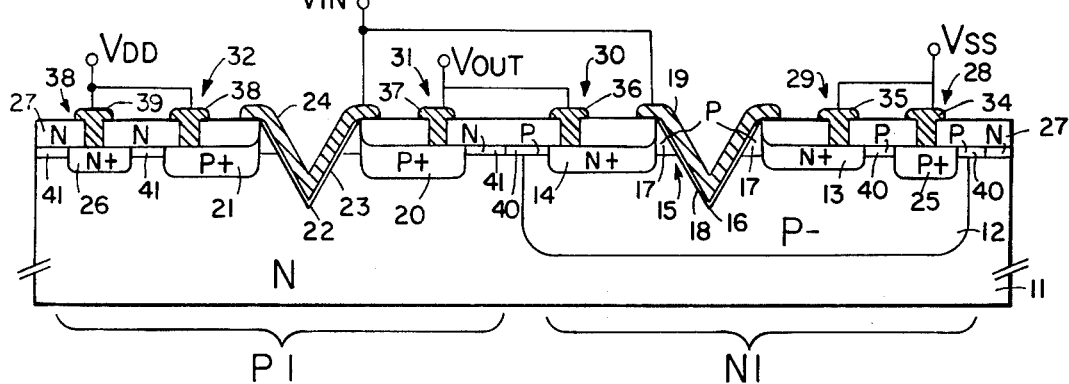
FIG. 1 shows a schematic, cross sectional view of a preferred short-channel self-aligned complementary V-groove MOS device made in accordance with the present invention.

FIG. 1 shows one of the preferred embodiments of the present complementary MOS (CMOS) transistor 10 invention. A lightly N-doped semiconductor substrate 11, usually silicon, having a (100) surface 9 and an impurity concentration in the range of $10^{13}$ to $10^{15}$ atoms per cubic centimeter is first provided, and a lightly p-coped tub 12 having a typical doping concentration of $10^{14}$ – $5 \times 10^{15}$ atoms/cm$^3$ is diffused therein. Spaced $N^+$ regions 13 and 14 are diffused into the p-type tub 12, forming source and drain regions of an n-channel MOS transistor N1, respectively. A mesa 15 projecting from the surface 9 of the p-type tub 12 lying between $N^+$ source and drain regions 13 and 14, with portions of source and drain 13 and 14 in said mesa 15, is provided. A p-type layer 17 having a typical impurity concentration in the range of $5 \times 10^{15}$ to $10^{18}$ atoms/cm$^3$ is provided lying immediately underneath and adjacent to portions of the $N^+$ regions 13 and 14 in said mesa 15, forming an effective channel layer of the transistor N1. A V-groove 16 having two side surfaces and two end surfaces extending from the mesa 15 into the p-type tub 12 is provided exposing the effective channel layer 17 and the p-type tub 12 on all four surfaces thereof. $N^+$ regions 13 and 14 are exposed by the two side surfaces of the V-groove 16 in the present example. A dielectric layer 18 of appropriate thickness is provided over the V-groove 16 forming a gate dielectric layer of the transister N1. A conducting layer 19 such as aluminum, p-doped polycrystalline silicon or N-doped polycrystalline silicon is provided over the gate dielectric layer 18 forming a gate electrode of transistor N1.

$P^+$ regions 20 and 21 are diffused into the N-type substrate 11 forming drain and source regions of a p-channel MOS transistor P1, respectively. A V-groove 22 lying between regions 20 and 21 having two side surfaces and two end surfaces is provided into n-type substrate 11 exposing the $P^+$ drain region 20 with a first side surface and the $P^+$ source region 21 with a second side surface. A conducting layer 24 is provided over a gate dielectric layer 23 formed over the V-groove 22. A $P^+$ region 25 and an $N^+$ region 26 are diffused into the p-type tub 12 and the n-type substrate 11, respectively, to provide ohmic contacts regions therein, thus form a tub-contact region and a substrate-contact region, respectively. A relatively thick field dielectric layer 27 is provided over the surface of the substrate 11 and the tub 12. Contact apertures 28, 29, 30, 31, 32 and 33 are etched through the field dielectric layer 27, and through these apertures, conductor means 34, 35, 36, 37, 38 and 39 are provided over regions 25, 13, 14, 20, 21 and 26 respectively. A p-type layer 40 underlying the thick field dielectric 27 in the p-type tub 12 encircling the N-channel transistor N1 and the p-type tub 12 forms a channel stopper layer for transistor N1. An N-type layer underlying the field dielectric layer 27 encircling the p-channel device P1 forms a channel stopper layer for the transistor P1.

In usual operations, the P+ tub-contact region 25 and the N+ source region 13 of transistor N1 are connected to a ground potential $V_{ss}$; the P+ source region 21 and the N+ substrate-contact region 26 are connected to a positive voltage $V_{dd}$; the N+ drain region 14 of transistor N1 and the P+ drain region 20 of transistor P1 are connected to an output electrode $V_{out}$; the gate conductors 19 and 24 are connected to an input electrode $V_{in}$. When an applied input voltage at the input electrode $V_{in}$ is at a high potential (exceeding the threshold voltage of the transistor N1), the transistor N1 become conductive while the transistor P1 is nonconductive to render the output signal at $V_{out}$ low ($V_{SS}$). When an applied input voltage at the input electrode $V_{in}$ is at a low level ($V_{SS}$), the transistor N1 is "turned-off" while transistor P1 is "turned-on" to render the output signal at the output electrode $V_{out}$ high ($V_{DD}$). Thus, the present CMOS invention, in this particular example, provides an inverter logic operation.

Referring now, again, to FIG. 1, V-shaped channels and gates are provided between source regions and drain regions of both the p-channel transistor P1 and N-channel transistor N1. Owing to the V-shaped structure, punch-through breakdown voltages are greatly enhanced (5-10 times) over conventional planar MOS transistors having same effective channel lengths and impurity concentrations. In conventional planar MOS transistor structures, it is difficult to provide channel length having a dimension of less than 3 microns. One reason is due to the low punch-through breakdown voltage limitation. A second reason is short-channel effects, such as, the threshold voltage become extremely sensitive to channel length variations and applied drain voltages. The present CMOS device provides solution to both these two problems. Thus, CMOS employing the present invention having channel length (or V-groove width) of 1 micron can be successfully fabricated. The present CMOS, thus, provides higher speeds than prior art CMOS devices. In addition, the N-channel transistor N1 of the present invention has extremely high gains since the effective channel length is formed by the thickness of the effective channel layer 17 which can be accurately controlled to less than 0.5 micron by ion implantation.

Figure 2A:
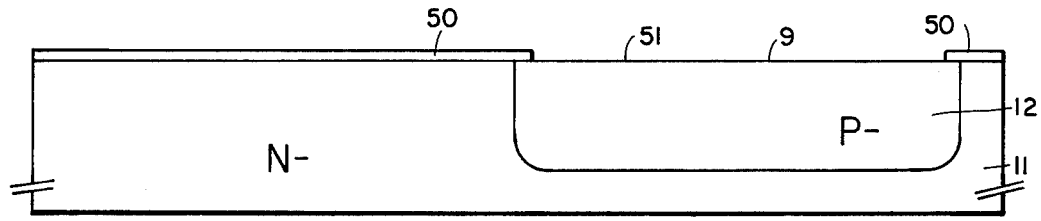
FIG. 2A to 2H are cross sectional views showing the successive steps in fabricating the CMOS device of FIG. 1.

Referring now to FIGS. 2A to 2H, the successive steps in manufacturing the CMOS device of FIG. 1 are illustrated. Referring now, particularly to FIG. 2A, a lightly n-doped silicon substrate 11, having a donor dopant concentration of $10^{14}$ atoms/cm$^3$ and a (100) surface 9 is provided. A layer of silicon dioxide 50 in the order of approximately 5,000 Å in thickness is first grown over the surface 9 of the substrate 11. Utilizing a first mask (not shown) in conjunction with conventional photolithographic and etching techniques, an oxide window 51 is opened, and a lightly p-doped tub 12 having an impurity level of about $1 \times 10^{15}$/cm$^3$ is formed through the window 51. The p-type tub 12 can be formed by first implanting boron ions into the semiconductor substrate 11 with a typical dose of $1 \times 10^{12}$ ions/cm$^2$ at an energy of 200 Kev, and than by diffusing or redistributing the implanted ions into the substrate 11 to a desired depth such as 8 microns.

Figure 2B:
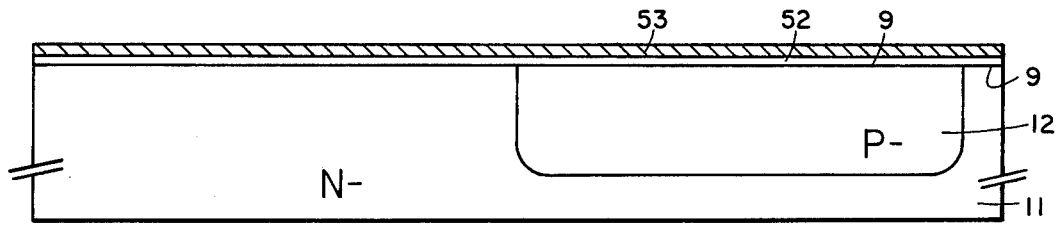
Figure 2C:
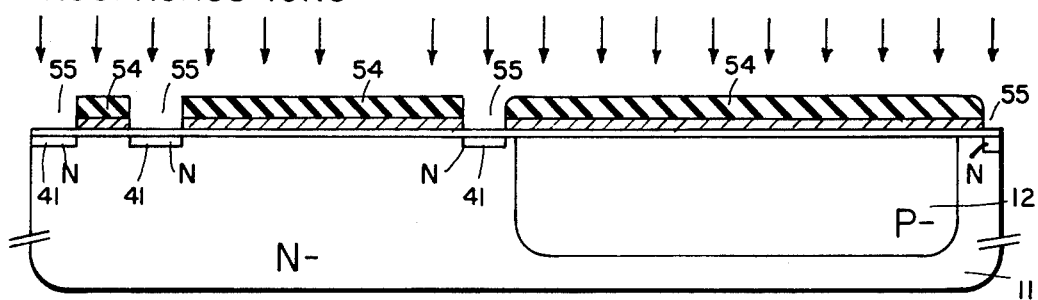

Next, referring to FIG. 2B, the silicon dioxide layer 50 is first removed by a buffered HF solution. A thin layer of silicon dioxide 52 in the order of 600 Å is thermally grown over the semiconductor surface. A layer of silicon nitride 53 in the order of 1,000 Å is then deposited on the silicon dioxide layer 52 by chemical vapor deposition. Next, referring FIG. 2C, utilizing a second mask, an n-type layer 41 is formed through openings 55 by a phosphorus ion implantation at an energy of 200 Kev and a dose of $3 \times 10^{12}$ ions/cm$^2$. The hardened photoresist 54 serves as a mask against the ion implantation. The portion of the silicon nitride layer 53 in the openings 55 is then removed.

Figure 2H:
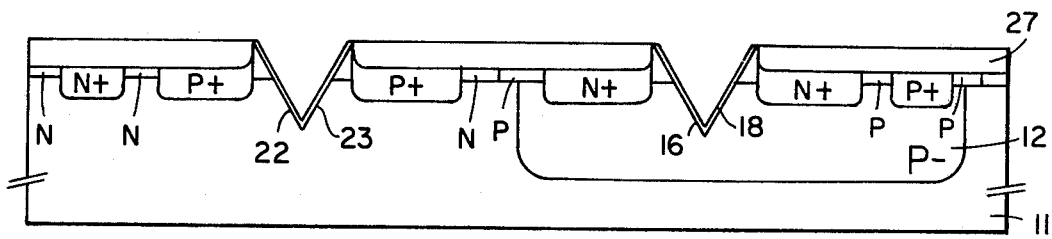
Figure 2D:
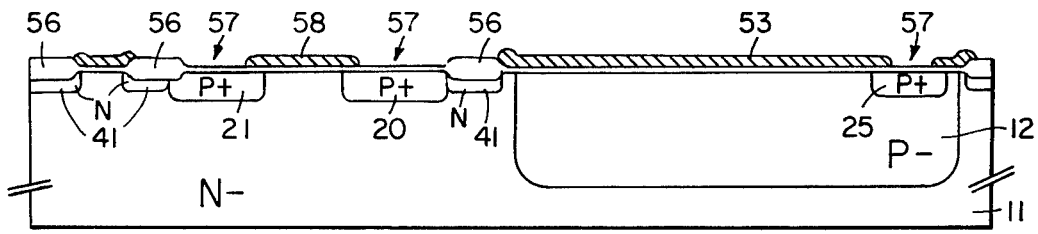

Next, referring to FIG. 2D, with the hardened photoresist 54 first removed, an oxide layer 56 of approximately 5,000 Å in thickness is grown over openings 55. Utilizing a third mask in conjunction with conventional photolithographic and etching techniques, openings 57 are formed with a region 58 between the openings 57 defining a first gate region. Boron diffusion is then performed to form a P+ region 25 in the p-type tub, and apaced P+ regions 20 and 21 in the n-type substrate 11. The typical junction depth of P+ regions 20 and 21 is about 1.5 to 2.5 micron.

Figure 2E:
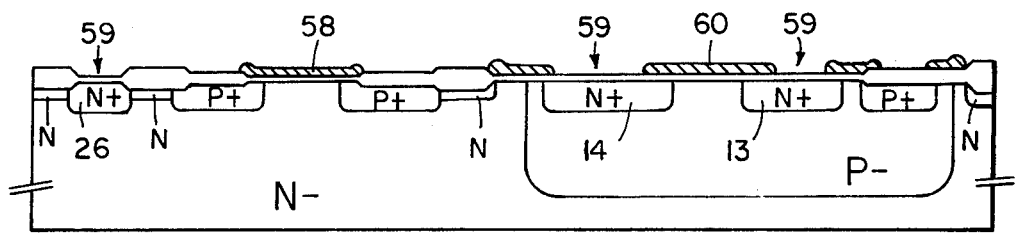

Next, referring to FIG. 2E, an oxide layer of approximately 5,000 Å is grown in windows 57. Utilizing a fourth mask in conjunction with conventional photolithographic and etching techniques, openings 59 are formed with a region 60 between the openings defining a second gate region. By diffusing suitable n-type impurities, such as phosphorus, N+ region 26 in the n-type substrate 11 and spaced N+ regions 13 and 14 in the p-type tub 12 are formed. The typical junction depth is about 1 micron.

Figure 2F:
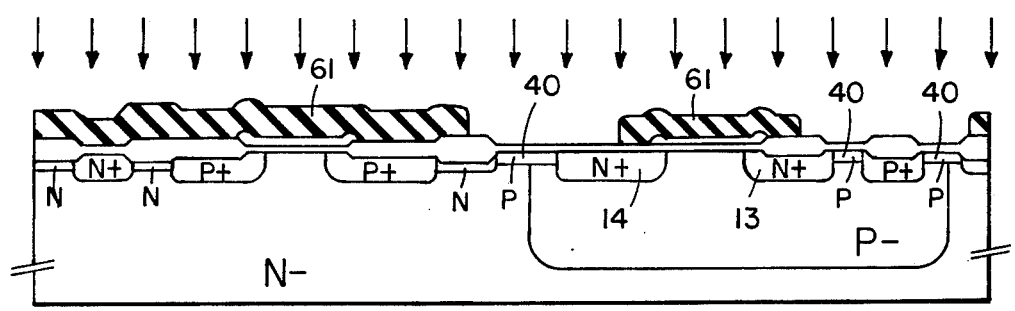

Next, referring to FIG. 2F, using a fifth mask with hardened photoresist 61 covering the gate region 60 and the regions outside the p-tub, the exposed nitride layer is removed; a blanket boron ion implantation at a typical dose of $1 \times 10^{13}$/cm$^2$ and energy of 200 Kev is performed to form a p-type layer 40.

Figure 2G:
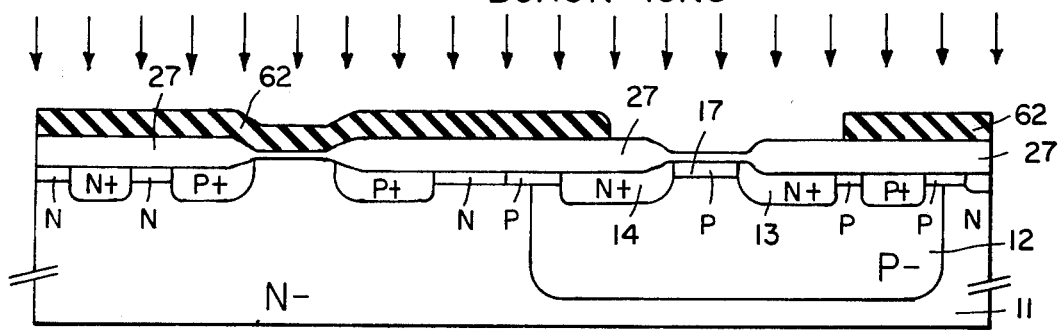

Next, referring to FIG. 2G, a relatively thick oxide layer 27 of 15,000 Å is grown with the silicon nitride layer at regions 60 and 58 as an oxidation mask. It is to be noted that the relatively thick oxide layer is of substantially uniform thickness. It is again to be noted that the edges of the masking nitride layer are lifted up due to oxidation in the lateral direction. Using a sixth mask with the hardened photoresist 62 covering the gate region 58, a boron ion implantation with a dose of $4 \times 10^{12}$/cm$^2$ and at an energy of 100 Kev is performed to form an effective channel layer 17.

Next, referring to FIG. 2H, the hardened photoresist 62, the silicon nitride layer and the thin oxide layer of 600 Å in the gate regions 58 and 60 are removed.

Next, anisotropic etching of silicon is performance to form V-grooves 16 and 22. A thin gate oxide layer 18 and 23 of approximately 600 Å is grown over the V-grooves respectively.

Next, contact apertures 28, 29, 30, 31, 32 and 33 are opened utilizing a seventh mask in conjunction with conventional photolithographic and etching techniques. Aluminum is then deposed and defined through an eighth mask in conjunction with conventional photolithographic and etching techniques to form a device of FIG. 1.

Figure 3:
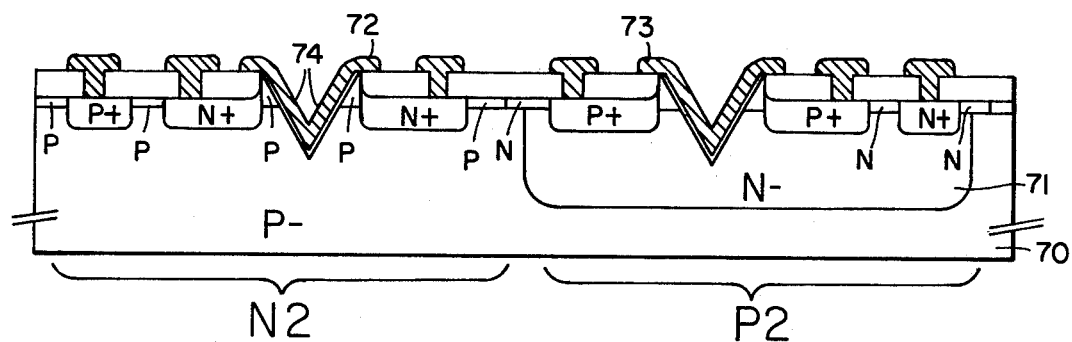
FIG. 3 shows a schematic cross sectional view of a second preferred CMOS made in accordance with the present invention.

A second embodiment of the present invention is shown in FIG. 3. An n-channel MOS transistor N2 similar to the n-channel transistor N1 of FIG. 1 is disposed in a p-type substrate 70, and a p-channel MOS transistor P2 similar to that of FIG. 1 is disposed in an n-type tub 71. It is to be noted that an p-type polycrystalline silicon 72 and 73 can be used as gate electrodes to achieve low threshold voltages, for example, 1 volt or less for the p-channel device P2. The impurity concentration for the effective channel layer 74 is preferred to be low, for example, ranges from $5 \times 10^{15} - 5 \times 10^{16}/cm^3$ in order to obtain low threshold voltages (1 volt or less) for the n-channel transistor N2.

The fabrication and device characteristics of the device of FIG. 3 is similar to those of FIG. 1.

What is claimed and desired to be secured by Letter Patent. What I claim:

1. A complementary metal-oxide-semiconductor field effect device comprising:
   a lightly N-doped semiconductor substrate having a first surface and a lightly P-doped tub therein;
   a first P-type region lying beneath and extending to said first surface in said semiconductor substrate;
   a second P-type region lying beneath and extending to said first surface in said semiconductor substrate;
   a first V-groove extending from said first surface into said semiconductor substrate lying between said first and said second P-type regions, said first V-groove having two side surfaces and two end surfaces exposing said first P-type region with a first side surface and exposing said second P-type region with a second side surface;
   a first relatively thin insulating layer overlying said first V-groove;
   a first N-type layer lying beneath and extending to said first surface in said substrate surrounding said first P-type region, said second P-type region and said first V-groove;
   a first N-type region lying beneath and extending to said first surface in said N-doped tub;
   a second N-type region lying beneath and extending to said first surface in said N-doped tub;
   a second V-groove extending from said first surface into said P-doped tub disposed between said first and said second N-type regions having two side surfaces and two end surfaces;
   a first P-type layer lying beneath and adjacent to a portion of said first and said second N-type regions exposed by all four surfaces of said V-groove;
   a second P-type layer lying beneath and extending to said first surface in said N-type tub surrounding said first and said second N-type regions and said second V-groove;
   a second relatively thin insulating layer overlying said second V-groove;
   a relatively thick insulating layer of substantially uniform thickness disposed over said first surface of said semiconductor substrate having openings therein over said first and said second P-type regions, and said first and said second N-type regions;
   first, second, third, and fourth electrodes respectively making electrical contact with said first, and said second P-type regions and said first and said second N-type regions; and
   fifth and sixth electrodes respectively overlying said first and said second relatively thin insulating layers.

2. The device of claim 1 wherein electrodes are made of aluminum.

3. The device of claim 1 wherein said first and said second N-type regions are exposed by the opposite side surfaces of said second V-groove.

4. The device of claim 1 wherein the impurity concentration of said N-doped semiconductor substrate ranges from about $10^{13}$ to about $10^{15}$ atoms/cm$^3$.

5. The device of claim 1 wherein the impurity concentration of said P-doped tub ranges from about $10^{14}$ to about $5 \times 10^{15}$ atoms/cm$^3$.

6. The device of claim 1 wherein the impurity concentration of said first P-type layer ranges from about $5 \times 10^{15}$ to $10^{18}$ atoms/cm$^3$.

7. The device of claim 1 wherein the thickness of said first p-type layer ranges from 0.05 to 1 micron.

8. The device of claim 1 wherein said first P-type region and said first semiconductor substrate are electrically connected.

9. The device of claim 1 wherein said second P-type region and said first N-type region are electrically connected.

10. The device of claim 1 wherein said P-doped tub and said second N-type region are electrically connected.

11. A complementary metal-oxide-semiconductor field effect device comprising:
   a. a lightly P-doped semiconductor substrate having a first surface and a lightly N-doped tub therein,
   b. a first P-type region lying beneath and extending to said first surface in said N-doped tub,
   c. a second P-type region lying beneath and extending to said first surface in said N-doped tub,
   d. a first V-groove extending from said first surface into said N-doped tub lying between said first and said second P-type regions, said first V-groove having two side surfaces and two end surfaces exposing said first P-type region with a first side surface and exposing said second P-type region with a second side surface,
   e. a first N-type layer lying beneath and extending to said first surface in said N-doped tub surrounding said first P-type region, said second P-type region, said first V-groove and said N-doped tub,
   f. a first relatively thin insulating layer overlying said first V-groove,
   g. a first electrode overlying said first relatively thin insulating layer,
   h. a first N-type region lying beneath and extending to said first surface in said semiconductor substrate,
   i. a second N-type region lying beneath and extending to said first surface in said semiconductor substrate,
   j. a second V-groove extending from said first surface into said semiconductor substrate disposed between said first and said second N-type regions,
   k. a first P-type layer lying beneath and adjacent to a portion of said first and said second N-type region in said semiconductor substrate exposed by all four surfaces of said second V-groove,
   l. a second P-type layer lying beneath and extending to said first surface in said semiconductor substrate surrounding said first and said second N-type regions and said second V-groove,
   m. a second relatively thin insulating layer overlying said second V-groove,
   n. a second electrode overlying said second relatively thin insulating layer, o. a relatively thick insulating layer of substantially uniform thickness disposed over said first surface of said semiconductor substrate having openings therein over said first and said second P-type regions, and said first and said second N-type regions, and p. first, second, third and fourth electrodes ov overlying said relatively thick insulating layer respectively making electrical contact with said first and said second P-type regions, and said first and said second N-type regions.

* * * * *